United States Patent
Perner

(10) Patent No.: US 6,765,834 B2
(45) Date of Patent: Jul. 20, 2004

(54) SYSTEM AND METHOD FOR SENSING MEMORY CELLS OF AN ARRAY OF MEMORY CELLS

(75) Inventor: Frederick Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 9 days.

(21) Appl. No.: 10/299,288

(22) Filed: Nov. 19, 2002

(65) Prior Publication Data

US 2004/0095826 A1 May 20, 2004

(51) Int. Cl.[7] .................................................. G11C 7/02
(52) U.S. Cl. ...................................... 365/209; 365/205
(58) Field of Search ................................. 365/209, 205, 365/129

(56) References Cited

U.S. PATENT DOCUMENTS 3,643,236 A * 2/1972 Kolankowsky et al. ....... 365/49
6,188,615 B1   2/2001 Perner et al. ........... 365/189.01

* cited by examiner

Primary Examiner—M. Tran
(74) Attorney, Agent, or Firm—Brian R. Short

(57) ABSTRACT

The invention includes a memory cell array sensing system. The memory cell array sensing system includes an array of memory cells located on a first plane of an integrated circuit. The array of memory cells includes groups of memory cells, wherein each group corresponds to a range of rows of the memory cells. A plurality of sense amplifiers located on a sense plane that is adjacent to the first plane, at least one sense amplifier being associated with each group. Multiple memory cells are simultaneously sensed by electrically connecting the multiple memory cells to sense amplifiers belonging to groups associated with the multiple memory cells, and to sense amplifiers not belonging to the groups associated with the multiple memory cells. A method of the invention includes electrically connecting multiple memory cells to sense amplifiers belonging to groups associated with the multiple memory cells, and to sense amplifiers not belonging to the groups associated with the multiple memory cells; and sensing logic states of the multiple memory cells.

21 Claims, 9 Drawing Sheets

ELECTRICALLY CONNECTING THE MULTIPLE MEMORY CELLS TO SENSE AMPLIFIERS BELONGING TO GROUPS ASSOCIATED WITH THE MULTIPLE MEMORY CELLS, AND TO SENSE AMPLIFIERS NOT BELONGING TO THE GROUPS ASSOCIATED WITH THE MULTIPLE MEMORY CELLS

810

SENSING LOGIC STATES OF THE MULTIPLE MEMORY CELLS

820

SYSTEM AND METHOD FOR SENSING MEMORY CELLS OF AN ARRAY OF MEMORY CELLS

FIELD OF THE INVENTION

The invention relates generally to electronic memory. More particularly, the invention relates to a system and method for sensing memory cells of an array of memory cells.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

FIG. 1 shows an array of random access memory (RAM) cells 110, a row decoder 120, a column decoder 130 and associated sense amplifiers 140. The row decoder 120 selects a row of the array of RAM cells 110 through a word line (WL). The column decoder 130 selects a column of the array of the RAM cell 110 through a bit line (BL). Generally, the sense amplifiers 140 are connectable to the bit lines. The sense amplifiers 140 provide sensing of states of the memory cells.

In a resistive RAM array, the resistance of each memory cell has more than one state. The data in a memory cell can be determined by measuring a resistive state of the cell. The resistive memory cells may include magnetic layers, a fuse or anti-fuse, or any element that stores information affecting a magnitude of a nominal resistance of the memory cell.

Magnetic random access memory (MRAM) is a type of resistive memory. MRAM can include a resistive cross point array of spin dependent tunneling (SDT) junctions. Each SDT junction memory element is located at a cross point of a word line and a bit line. The magnetization of each SDT junction assumes one of two stable orientations at any given time. These two stable orientation, parallel and anti-parallel, represent logic values of "0" and "1." The magnetization orientation affects the resistance of the SDT junction. The resistance of the SDT junction is a first value if the magnetization orientation is parallel and a second value if the magnetization orientation is anti-parallel. The magnetization orientation of the SDT junction, and therefore, its logic value may be determined by sensing the resistance of the SDT junction.

Generally, sensing the resistance of an SDT junction requires sensing relatively small signals. The resistance, and therefore, the logical state of an SDT junction can be determined by applying a voltage across the SDT junction and sensing the resultant current, or by applying a current through the SDT junction and sensing the resulting voltage across the SDT junction. SDT junctions include physical characteristics that require sensing either a small amplitude sense current, or a small amplitude sense voltage.

It should be noted that other types of RAM (for example, SRAM and DRAM) do not require the signal noise and interference minimization required by MRAM, because other types of memory generally operate with much larger sense signals.

Prior art MRAM structures generally do not provide efficient use of MRAM sensors. That is, many MRAM sensors of a particular MRAM structure remain unused during an access of information stored within memory cells of the MRAM structure. This limits the capacity to access information within the MRAM structure.

It is desirable to have a system and method for sensing a large number of memory cells of an array of memory cells. It is desirable that sensors used to sense states of the memory cells be efficiently utilized. The system and method should be adaptable for used with arrays of MRAM memory cells.

SUMMARY OF THE INVENTION

The invention includes a system and method for sensing a large number of memory cells of an array of memory cells. The system and method provide for efficient use of sensors that sense the states of the memory cells. The system and method are adaptable for use with MRAM.

An embodiment of the invention includes a memory cell array sensing system. The memory cell array sensing system includes an array of memory cells located on a first plane of an integrated circuit, the array of memory cells including groups of memory cells, wherein each group corresponds to a range of rows of the memory cells. A plurality of sense amplifiers are located on a sense plane that is adjacent to the first plane, at least one sense amplifier being associated with each group. Multiple memory cells are simultaneously sensed by electrically connecting the multiple memory cells to sense amplifiers belonging to groups associated with the multiple memory cells, and to sense amplifiers not belonging to the groups associated with the multiple memory cells.

Another embodiment of the invention includes a method of sensing a state of selected memory cells within a memory cell array sensing system. The method includes electrically connecting multiple memory cells to sense amplifiers belonging to groups associated with the multiple memory cells, and to sense amplifiers not belonging to the groups associated with the multiple memory cells. Logic states of the multiple memory cells are sensed.

Other aspects and advantages of the present invention will become apparent from the following detailed description, taken in conjunction with the accompanying drawings, illustrating by way of example the principles of the invention.

DETAILED DESCRIPTION

Figure 1:
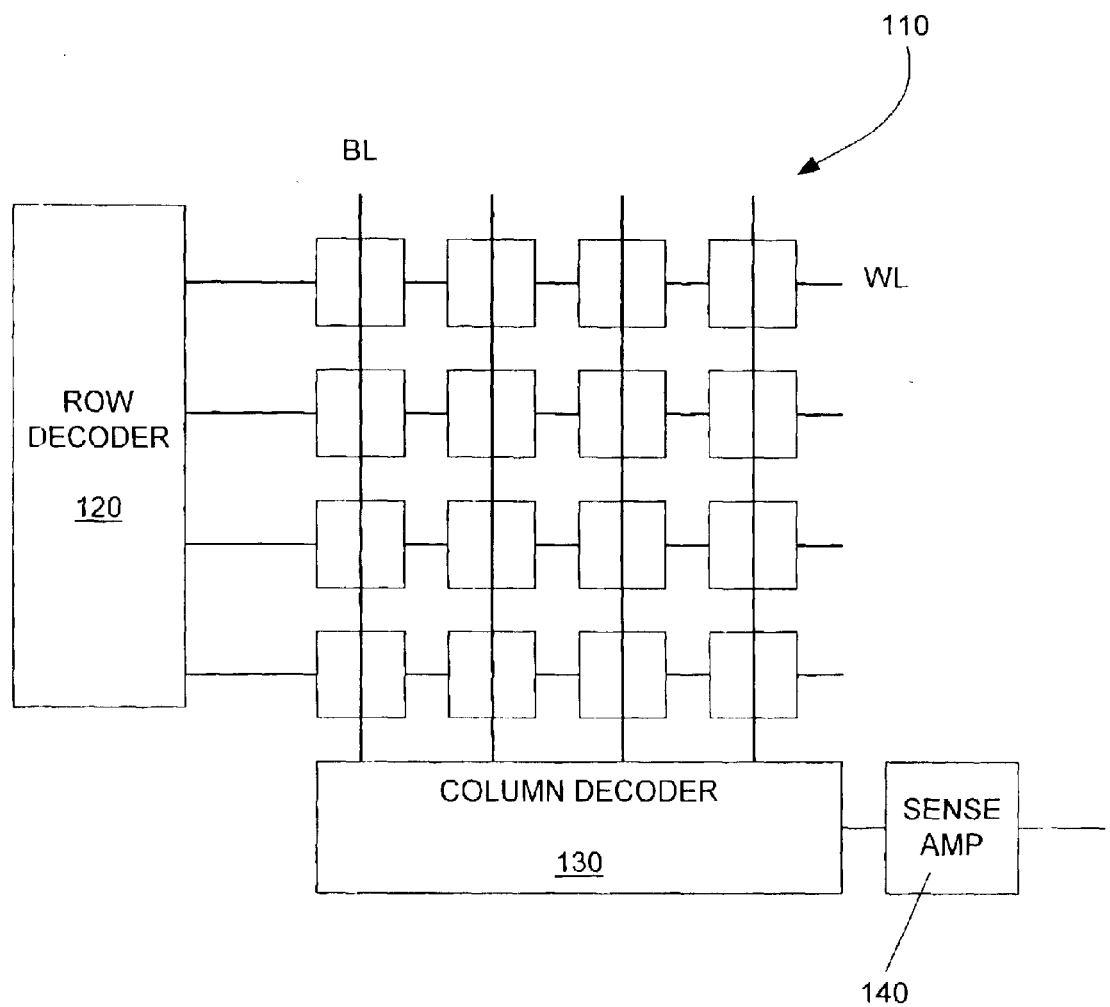
FIG. 1 shows a prior art integrated circuit that includes an array of memory cells and associated control circuitry located on a common plane.

As shown in the drawings for purposes of illustration, the invention is embodied in a system and method for sensing a large number of memory cells of an array of memory cells. The system and method provide for efficient use of sensors that sense the states of the memory cells. The system and method are adaptable for use with MRAM.

The resistance of each memory cell within a resistive RAM array has more than one state, and data in the memory can be determined by measuring the resistive state of the cell. The resistive memory cells can include one or more magnetic layers, a fuse or anti-fuse, or any element that stores or generates information by affecting the magnitude of the nominal resistance of the element. Other types of resistive elements used in a resistive RAM array include polysilicon resistors as part of a read-only memory, or floating gate transistors as part of optical memory, imaging devices or floating memory devices.

Figure 2:
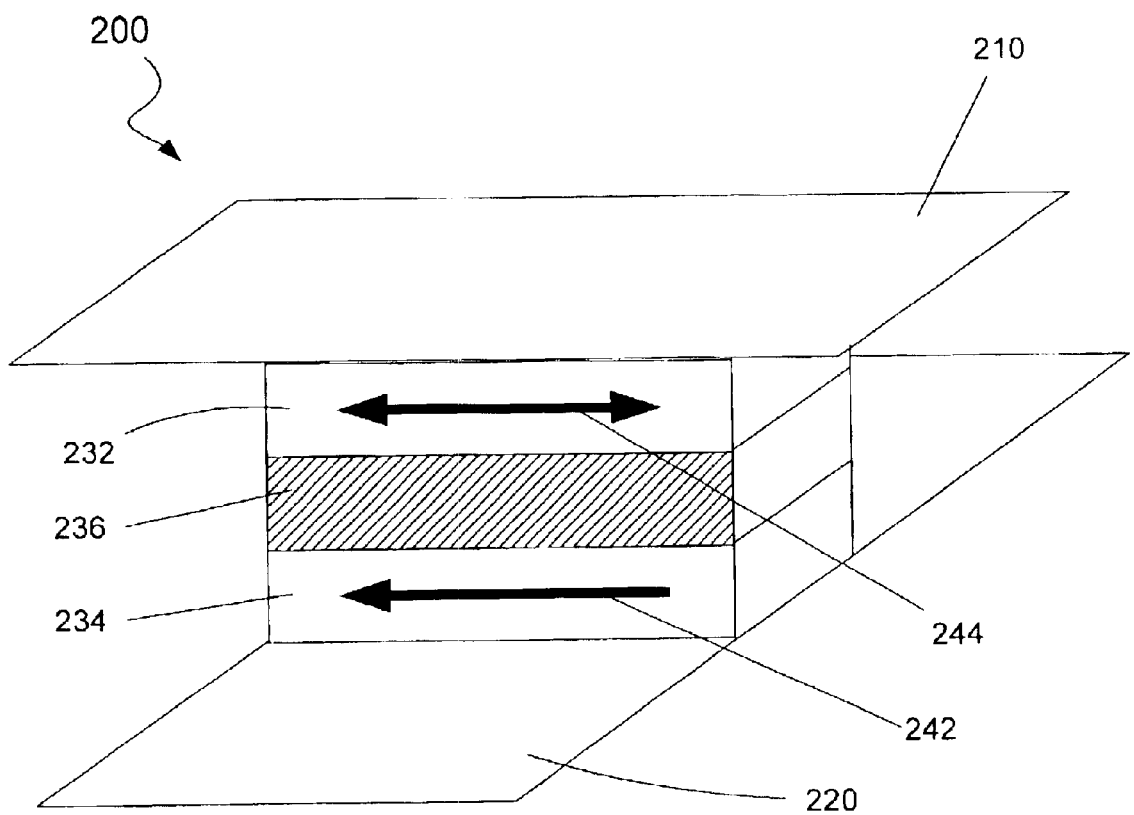
FIG. 2 shows an MRAM memory cell.

FIG. 2 shows an MRAM memory cell 200. The MRAM memory cell 200 can include a three layer magnetic tunnel junction memory cell. The magnetic tunnel junction stores a bit of information according to an orientation of a soft magnetic sense layer 232. Generally, the memory cell 200 includes two magnetic states that correspond to logical states of "1" and "0." The two-way arrow 244 of the sense layer 232 represents the binary states of the memory cell 200.

The memory cell 200 further includes a pinned layer 234. The pinned layer 234 includes a fixed magnetic orientation as depicted by the one-way arrow 242. As the name suggests, the magnetic orientation of the pinned layer 234 remains fixed.

The pinned layer 234 and the sense layer 232 are physically separated by an insulating layer 236. A resistance across the magnetic tunnel junction memory cell is determined by characteristics of the insulating layer, and the magnetic orientation of the sense layer 232 relative to the magnetic orientation of the pinned layer 234. If the magnetic orientation of the sense layer 232 is in the same direction as the magnetic orientation of the pinned layer 234, the memory cell 200 is in a "parallel" state. Similarly, if the magnetic orientation of the sense layer 232 is in the opposite direction as the magnetic orientation of the pinned layer 234, the memory cell 200 is in an "anti-parallel" state. The two mentioned orientations correspond to a low resistance state and a high resistance state, respectively. The low resistance state can correspond to the "0" state, and the high resistance state can correspond to the "1" state, or vice versa.

The magnetic state of a selected memory cell 200 can be altered by applying currents through a word line 210 and bit line 220 that are connected to each end of the memory cell 200. Currents conducting through the word line and the bit line produce two orthogonal magnetic fields that can switch the magnetic orientation of the sense layer 232 of the selected memory cell between the parallel and anti-parallel states. Unselected memory cells within an array of memory cells are exposed to only a magnetic field from either the word line or the bit line crossing (connected to) the unselected memory cells. The single field exposure is generally not strong enough to change the magnetic orientation of the sense layer 232 of the unselected memory cells. Therefore, the unselected memory cell retain their original magnetic orientations.

Figure 3:
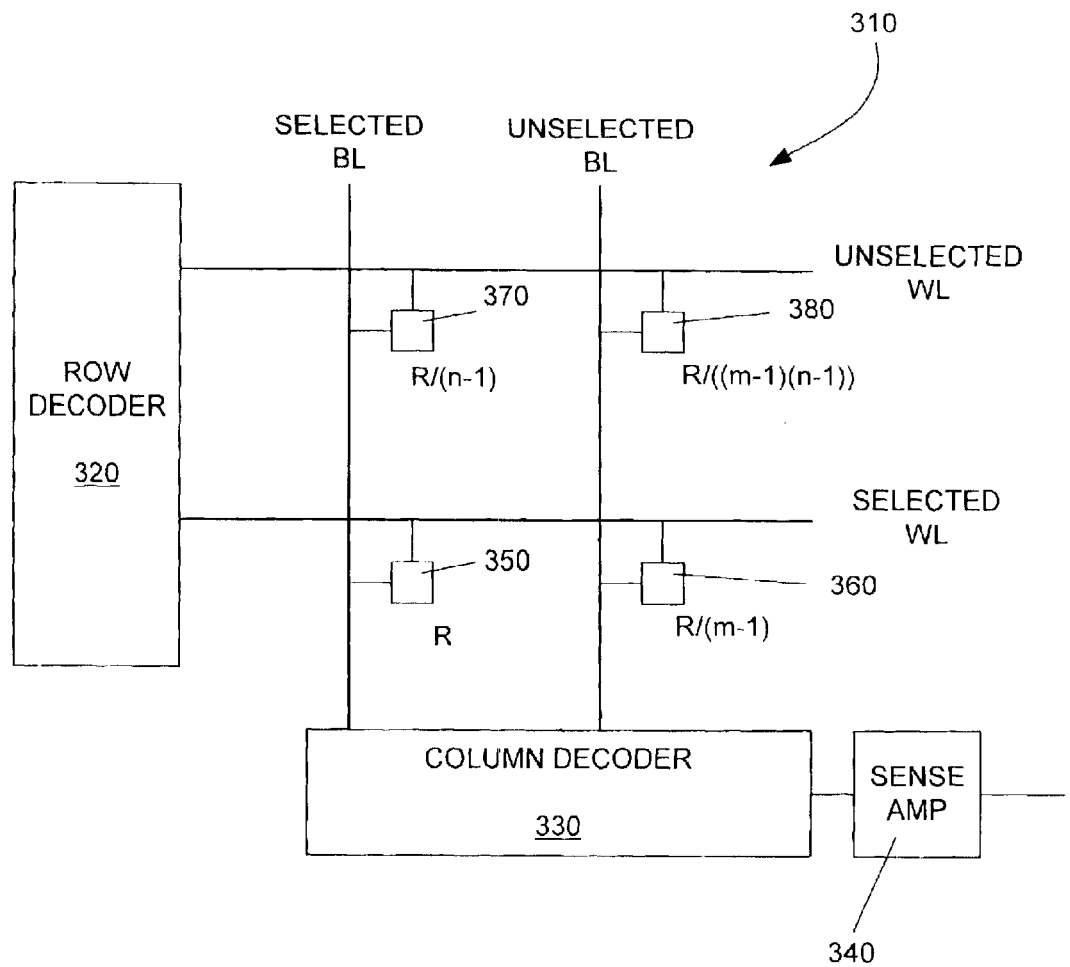
FIG. 3 shows a circuit schematic of an array of resistive MRAM memory cells and sense amplifiers.

FIG. 3 shows a circuit schematic of an array of resistive MRAM memory cells 310 and sense amplifiers 340. Here, the memory cells include resistors 350, 360, 370, 380. Generally, a row selector 320 selects rows of the memory cells through word lines (WL), and a column selector 330 selects columns of the memory cells through bit lines (BL).

FIG. 3 provides a depiction of the resistance of a selected memory cell relative to the combined resistances of the unselected memory cell in a memory array having m columns and n rows. The selected memory cell 350 is located between the selected bit line (BL) and the selected word line (WL), and includes a resistance value represented by R.

There are m−1 other memory cells in the same word line as the selected memory cell 350. Assuming the other memory cells each have nominally the same resistance value R, then they have a cumulative resistance value of $R/(m-1)$, as shown by the equivalent resistance element 360. Similarly, there are n−1 other memory cells in the same bit line or column as the selected memory cell 350. Assuming the other memory cells each nominally have the same resistance value R, the they have a cumulative resistance value of $R/(n-1)$, as shown at resistive element 370. Finally, there are (m−1)(n−1) other memory cells in the rest of the memory array that are not located on the same word line and bit line as the selected memory cell 350. Assuming each of these memory cells has a resistance value of R, then they have a cumulative resistance of $R/((m-1)(n-1))$, as shown at resistive element 380.

Figure 4A:
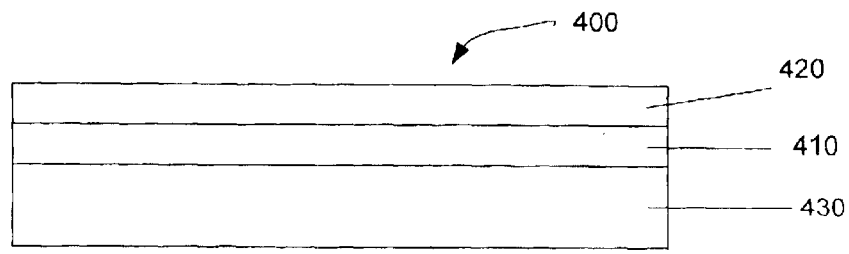
FIG. 4A shows a side-view and FIG. 4B shows a top-view of an embodiment of an integrated circuit that includes an array of MRAM memory cells on a first layer and sense amplifiers and selection circuitry on another layer.
Figure 4B:
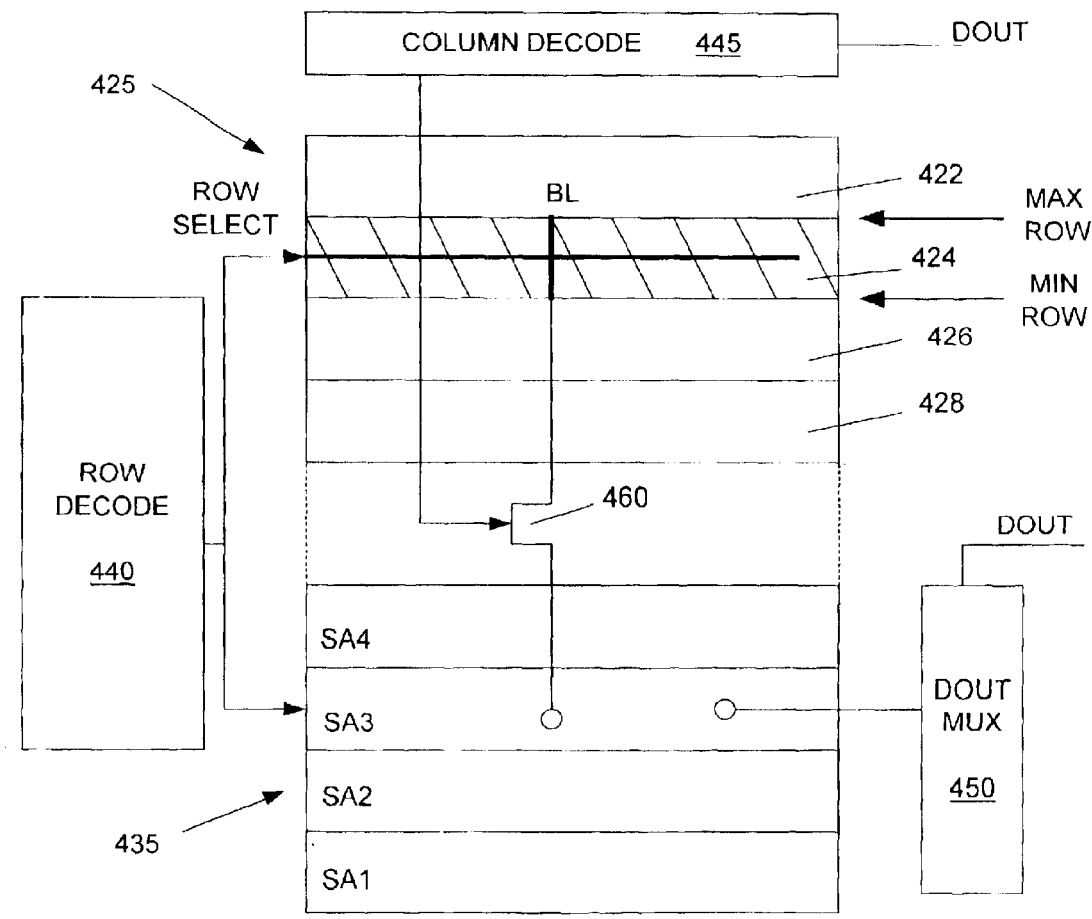

FIG. 4A shows a side-view and FIG. 4B shows a top-view of an embodiment of an integrated circuit 400 that includes an array of MRAM memory cells 425 on a first layer 420 and sense amplifiers 435, row decode circuitry 440, column decode circuitry 445, and output multiplexer circuitry 450 on another layer 410. The layers 410, 420 are formed over a substrate 430.

This embodiment includes memory cells that are defined by groups. For example, the embodiment of FIG. 4B includes four groups 422, 424, 426, 428 of memory cells. The groups 422, 424, 426, 428 are defined by memory cells that are selected within a range of rows of memory cells. FIG. 4B includes a shaded region that designates a selected group of memory cells. The range of rows of memory cells that define the group include a minimum row address and a maximum row address. All memory cells selected by a row address between the minimum row address and the maximum row address are within the same designated group.

A group 422, 424, 426, 428 is selected if any row of memory cells within the group 422, 424, 426, 428 is selected. The row decoder 440 selects at least one of many rows. The selected row of FIG. 4B is within the minimum row address (MIN ROW) and the maximum row address (MAX ROW) of the group 424. Therefore, the group 424 is designated as a selected group.

This embodiment further includes a sense amplifier (SA3) located on the adjacent layer 410 that is associated with the selected group 424 of memory cells. That is, memory cells having row addresses within the designated range are connected to the sense amplifier (SA3) that is associated with the group 424 the selected memory cells are associated.

Each of the groups includes an associated sense amplifier. For example, a first group 428 of memory cells of the first layer 420, include a sense amplifier SA1 of the sense layer 410. A second group 426 of memory cells of the first layer 420, include a sense amplifier SA2 of the sense layer 410. The third group 424 of memory cells of the first layer 420, include the sense amplifier SA3 of the sense layer 410. A fourth group 422 of memory cells of the first layer 420, include a sense amplifier SA4 of the sense layer 410.

The row decoder 440 selects a row, and the column decoder 445 selects a column. Generally, the column decoder selects a bit line (BL) as shown in FIG. 4B. The column decoder 445 effectively "turns on" or closes an electrical switch 460, that electrically connects a memory cell designated by the selected row and selected column, to the sense amplifier (for example SA3) associated with the same group as the selected memory cell.

The selected sense amplifier (SA3) is electrically connected to an output multiplexer 450. The output multiplexer 450 generates a single output DOUT.

A limitation to the embodiment of FIG. 4A and FIG. 4B, is that only a single sense amplifier can be activated at a time. The single sense amplifier generates a single output. It is desirable to more efficiently utilize the sense amplifiers, and to generate an output that includes the sensed states of more memory cells.

Figure 5A:
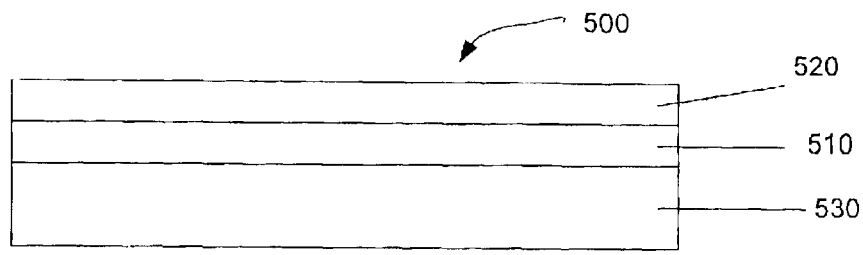
FIG. 5A shows a side-view and FIG. 5B shows a top-view of an integrated circuit that includes an array of MRAM memory cells on a first layer and sense amplifiers on another layer according to an embodiment of the invention.
Figure 5B:
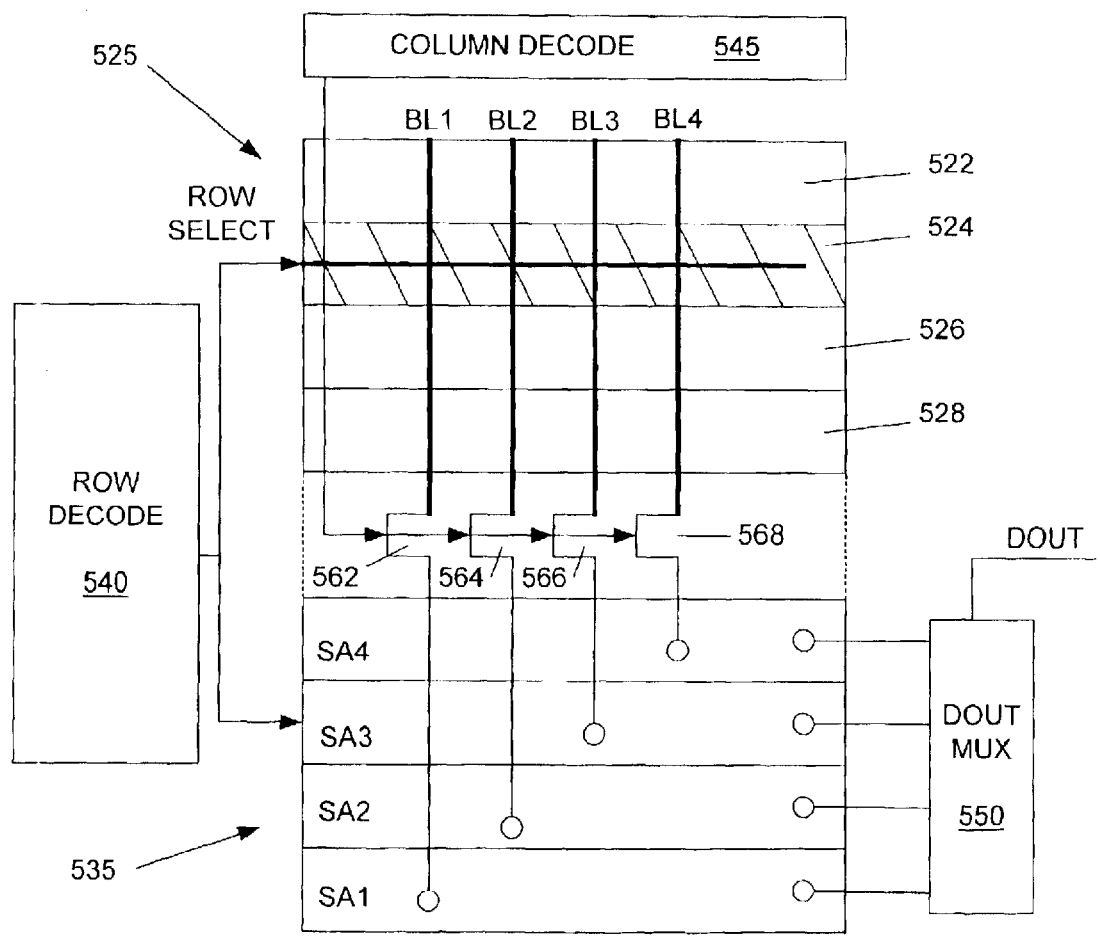

FIG. 5B shows a top-view and FIG. 5A show a side-view of a memory cell array sensing system according to an embodiment of the invention. An array of memory cells 525 are located on a first plane 520 of an integrated circuit 500. The array of memory cells 525 include groups 522, 524, 526, 528 of memory cells. Each group 522, 524, 526, 528 corresponds to a range of rows of the memory cells 525.

Sense amplifiers 535 (SA1, SA2, SA3, SA4) are located on a sense plane 510 that is adjacent to the first plane 520. At least one sense amplifier (SA1, SA2, SA3, SA4) is associated with each group 522, 524, 526, 528 of memory cells. A sense amplifier (SA1, SA2, SA3, SA4) can be designated as being associated with a group of memory cells if the sense amplifier is located directly adjacent to the group of memory cells. A sense amplifier (SA1, SA2, SA3, SA4) can be designated as being associated with a group of memory cells if the sense amplifier is a one of the sense amplifiers that is physically located the closest to the group of memory cells.

As shown in FIG. 5A and FIG. 5B, sense amplifier SA1 associated with the group 528 of memory cells because the sense amplifier SA1 is located directly below the group 528. Sense amplifier SA2 is associated with the group 526 of memory cells because the sense amplifier SA2 is located directly below the group 526. Sense amplifier SA3 is associated with the group 524 of memory cells because the sense amplifier SA3 is located directly below the group 524. Sense amplifier SA4 is associated with the group 522 of memory cells because the sense amplifier SA4 is located directly below the group 522.

A memory cell group area of the first plane 520 can be defined as the area occupied by a group of memory cells. The memory cell group area can be defined by a physical pitch between rows of the memory cells. An embodiment includes a sense amplifier area occupied by each sense amplifier of the sense plane, being approximately equal to the memory cell group area occupied by the group of memory cells. Additionally, the sense amplifier area of a sense amplifier associated with a group can be adjacent to the memory cell group area of the group of memory cells within the same group.

Other group designations of memory cells and sense amplifiers are included within the invention.

Multiple memory cells can be simultaneously sensed by electrically connecting the multiple memory cells to sense amplifiers SA1, SA2, SA3, SA4 belonging to groups 522, 524, 526, 528 associated with the multiple memory cells, and to sense amplifiers SA1, SA2, SA3, SA4 not belonging to the groups 522, 524, 526, 528 associated with the multiple memory cells.

Generally, the array of memory cells are arranged in rows and columns. A row decoder 540 generates a row selection (ROW SELECT) through a word line, and a column decoder 545 generates at least one column selection through the column decoder lines.

An embodiment includes a single word line selecting a single row from a selected group 524 of memory cells. Multiple memory cells of the selected row of the selected group 524 are simultaneously sensed through the selection of the column decoder lines.

The selected multiple memory cells are simultaneously sensed by electrically connecting the multiple memory cells to sense amplifiers through bit lines (BL1, BL2, BL3, BL4) that extend along the columns of memory cells, and are connectable between the multiple memory cells and the sense amplifiers. As shown in FIG. 5B, the bit lines connect the multiple selected memory cells of the group 524 to the sense amplifiers SA1, SA2, SA3, SA4 through electrical switches 562, 564, 566, 568. The bit lines extend across multiple groups 522, 524, 526, 528 of memory cells, and across multiple sense amplifiers SA1, SA2, SA3, SA4.

The sense amplifiers SA1, SA2, SA3, SA4 are electrically connected to an output multiplexer 550. The output multiplexer 550 generates a single output DOUT.

Figure 6:
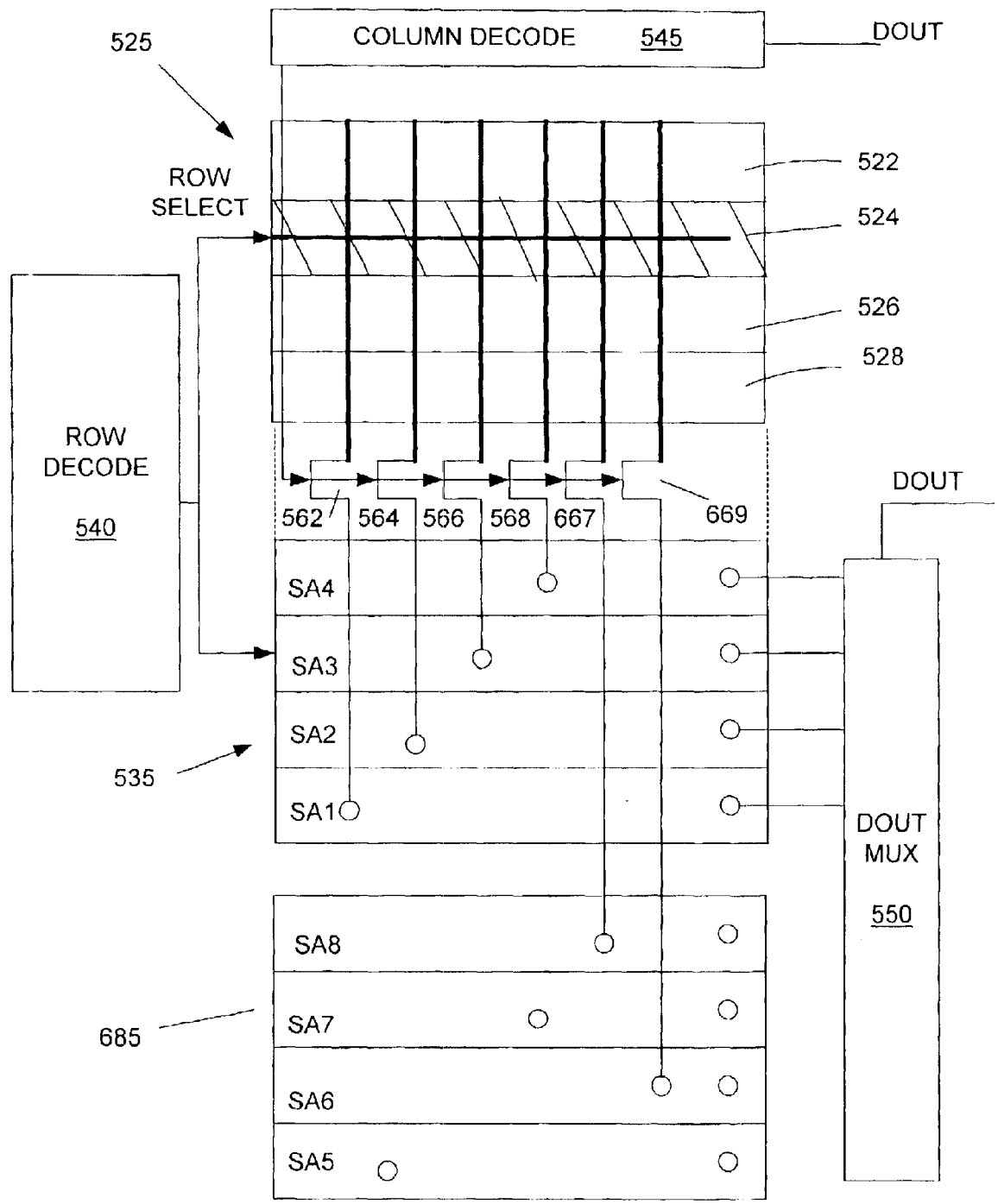
FIG. 6 shows blocks of MRAM memory cells according to an embodiment of the invention.

FIG. 6 shows sense amplifiers 535, 685 that are associated with separate blocks of MRAM memory cells according to an embodiment of the invention. The memory cells 525 and the sense amplifiers 535 form a block in which the memory cells 525 are formed over the sense amplifiers 535. The sense amplifiers 685 are not formed over the memory cells 525, but may be formed over another block of memory cells.

A block of memory cells can be defined as an architectual building unit. A block is generally defined by a rectangular group of memory cells with basic row and column address selection and sensing capabilities. DRAM and SRAM typically divide large memory integrated circuits into arrays of sub-blocks based upon a target performance for the memory.

An MRAM block definition generally considers performance of the sense lines in one direction and utilizing an area under the memory cell array for sense functions in a second direction. The general MRAM definition of a block is an area for MRAM sensing and selecting functions which is covered by memory cells.

FIG. 6 shows that the memory cells 525 can be electrically connected to the sense amplifiers SA1, SA2, SA3, SA4 of the same block as the memory cells 525, and the memory cells 525 can be electrically connected to sense amplifiers SA5, SA6, SA7, SA8 which belong to a different block as the memory cells 525. Switches 667, 669 can be used to electrically connect memory cells of the group 524 to the sense amplifiers SA6, SA7.

Figure 7:
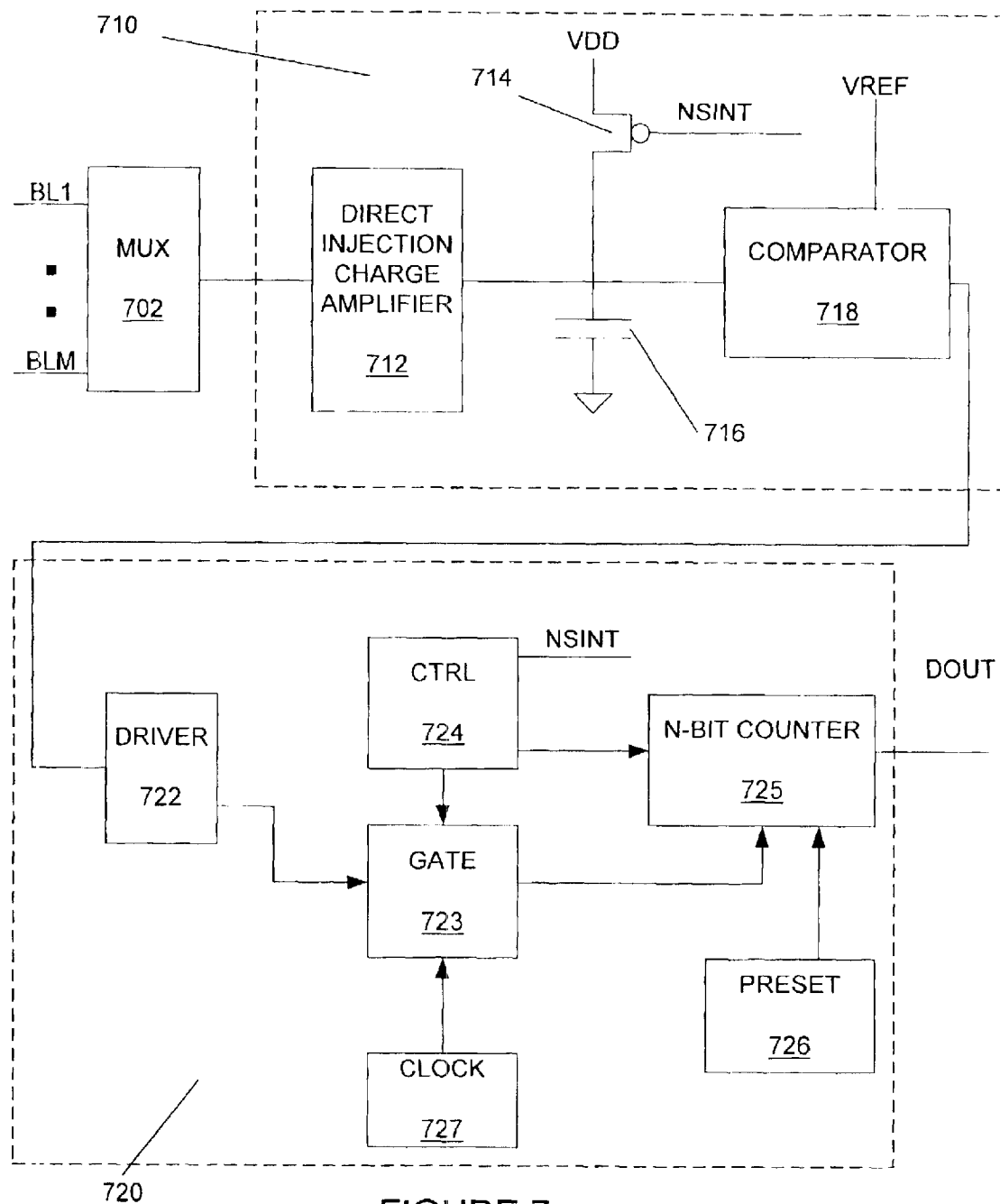
FIG. 7 shows an embodiment of analog sense circuits and a digital sense circuits of a sense amplifier.

FIG. 7 shows an embodiment of an analog section 710 of a sense amplifier and a digital section 720 of a sense amplifier. These are merely examples of a possible analog section 710 and a digital section 720. Other possible configurations are possible. As previously described, the analog section 710 can be connectable to multiple digital sections 720 depending upon a physical location of multiple digital sections 720 with respect to a physical location of a selected memory cell.

The analog section 710 receives a bit line to be sensed from a previously described multiplexer (MUX) 702. The analog section 710 can include a direct injection charge amplifier (DICA) 712, a reset switch 714, an integrator capacitor 716, and a comparator 718.

The reset switch 714 may be a PMOS transistor. An external control signal (NSINT) controls whether the reset switch 714 is on (conducting) or off (not conducting). When the reset switch 714 is on, a supply voltage (VDD) is applied to the integrator capacitor 716 and a selected memory cell through the DICA 712. The integrator capacitor 716 is charged as current flows through the reset switch 714 and a selected memory cell. When the reset switch 714 is off, current flowing to the selected memory cell is supplied by the integrator capacitor 716. As long as the integrator capacitor 716 voltage is greater than a voltage across the selected memory cell, the integrator capacitor functions as an integrator.

A DICA 712 that can minimize a voltage difference across memory cells is disclosed in U.S. Pat. No. 6,188,615, issued on Feb. 13, 2001. The DICA 712 includes a high gain negative feedback amplifier for controlling a selected bit line voltage (a sense voltage) to a set value and minimizing the variance of the sense voltage over a wide range of sense currents.

A resistance of a selected memory cell and the capacitance of the integrator capacitor 716 determine how fast the integrator capacitor 716 is discharged after the reset switch 714 is opened. All other parameters being equal, the integrator capacitor 716 discharges faster when the selected memory cell has a resistance of R (a first state) than when the selected memory cell has a resistance of R plus delta R (a second state).

The sense amplifier (analog and digital sections) measures the integration time to determine the resistive state of the selected memory cell, and therefore, the logic value stored in the selected memory cell. The voltage potential of the integrator capacitor 716 is compared to a reference voltage (VREF) by the comparator 718. The output of the comparator 718 is connected to the digital section 720 of the sense amplifier through a driver 722.

The digital section 720 can include the driver 722, an N-bit counter 725, a high frequency clock 727, a gate 723, a controller 724 and a present unit 726.

The gate 723 determines the starting and stopping of the clock 727. The clock 727 causes the counter 725 to increment a counter value at the clock frequency. If the clock 727 is started when the reset switch 714 is turned off, and the clock 727 is stopped when the integrator capacitor 716 equals the reference voltage (VREF), the counter value stored in the counter 725 indicates the amount of time for voltage on the integrator capacitor 716 to decay to the reference value (VREF).

Sensing a selected memory cell without resetting the counter 725 to a zero value produces a cumulative time measurement. Before a read operation (sensing of a selected memory cell state), the negative of a threshold is preloaded into the counter 725. After a cumulative time measurement, the most significant bit of the counter value represents the logic value stored in the selected memory cell. An output DOUT is the most significant bit of the counter 725.

A preset unit 726 can temporarily store values of the counter 725, and can up load its content into the counter. The preset unit 726 can also be loaded with specific values.

The controller 724 provides control of the reset switch 714, the counter 725, the gate 723, and the preset unit 726. The controller 724 allows the sense amplifier to operate under different modes.

Figure 8:
FIG. 8 shows acts of a method according to an embodiment of the invention.

FIG. 8 shows acts of a method according to an embodiment of the invention. The embodiment includes a method of sensing a state of selected memory cells within a memory cell array sensing system. The memory cell array sensing system includes an array of memory cells located on a first plane of an integrated circuit. The array of memory cells includes groups of memory cells. Each group corresponds to a range of rows of the memory cells. The memory cell array sensing system further includes a plurality of sense amplifiers located on a sense plane that is adjacent to the first plane. At least one sense amplifier is associated with each group.

A first step 810 includes electrically connecting the multiple memory cells to sense amplifiers belonging to groups associated with the multiple memory cells, and to sense amplifiers not belonging to the groups associated with the multiple memory cells.

A second step 820 includes sensing logic states of the multiple memory cells.

The multiple memory cells can be electrically connected to the sense amplifier through input lines that extend along the columns of memory cells, and are connectable between the multiple memory cells and the sense amplifiers.

Figure 9:
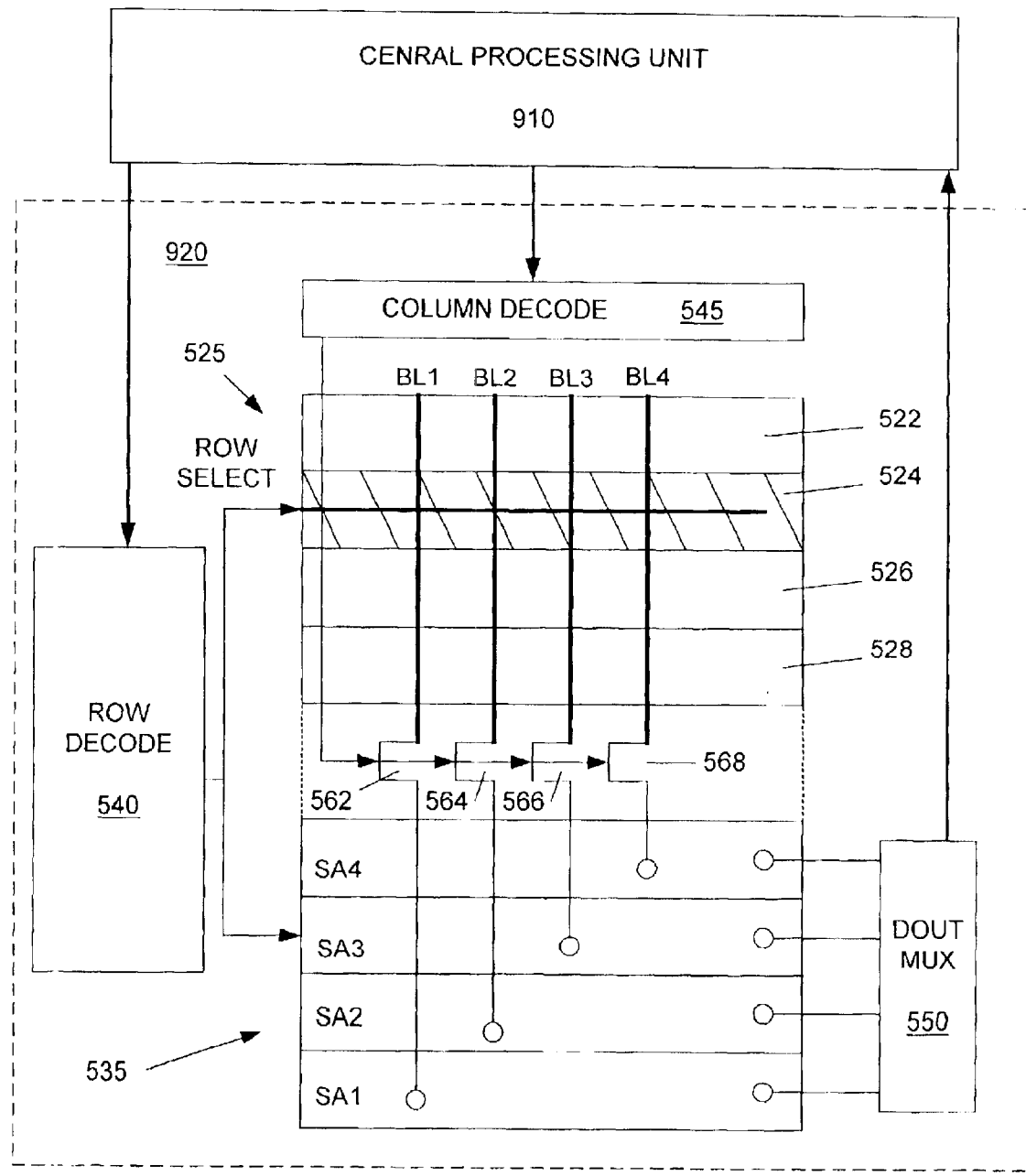
FIG. 9 shows a computer system according to an embodiment of the invention.

FIG. 9 shows a computer system according to an embodiment of the invention. The computer system includes a central processing unit 910. The central processing unit 910 is connected to MRAM memory 920.

The MRAM memory 920 includes an array of memory cells 525 are located on a first plane of an integrated circuit 500. The array of memory cells 525 include groups 522, 524, 526, 528 of memory cells. Each group 522, 524, 526, 528 corresponds to a range of rows of the memory cells 525.

Sense amplifiers 535 (SA1, SA2, SA3, SA4) are located on a sense plane that is adjacent to the first plane. At least one sense amplifier (SA1, SA2, SA3, SA4) is associated with each group 522, 524, 526, 528 of memory cells. A sense amplifier (SA1, SA2, SA3, SA4) can be designated as being associated with a group of memory cells if the sense amplifier is located directly adjacent to the group of memory cells. A sense amplifier (SA1, SA2, SA3, SA4) can be designated as being associated with a group of memory cells if the sense amplifier is a one of the sense amplifiers that is physically located the closest to the group of memory cells.

As shown in FIG. 5A and FIG. 5B, sense amplifier SA1 associated with the group 528 of memory cells because the sense amplifier SA1 is located directly below the group 528. Sense amplifier SA2 is associated with the group 526 of memory cells because the sense amplifier SA2 is located directly below the group 526. Sense amplifier SA3 is associated with the group 524 of memory cells because the sense amplifier SA3 is located directly below the group 524. Sense amplifier SA4 is associated with the group 522 of memory cells because the sense amplifier SA4 is located directly below the group 522. Other group designations of memory cells and sense amplifiers are included within the invention.

Multiple memory cells can be simultaneously sensed by electrically connecting the multiple memory cells to sense amplifiers SA1, SA2, SA3, SA4 belonging to groups 522, 524, 526, 528 associated with the multiple memory cells, and to sense amplifiers SA1, SA2, SA3, SA4 not belonging to the groups 522, 524, 526, 528 associated with the multiple memory cells.

Although specific embodiments of the invention have been described and illustrated, the invention is not to be limited to the specific forms or arrangements of parts so described and illustrated. The invention is limited only by the appended claims.

What is claimed:

1. A memory cell array sensing system comprising:
   an array of memory cells located on a first plane of an integrated circuit, the array of memory cells comprising groups of memory cells, wherein each group corresponds to a range of rows of the memory cells;
a plurality of sense amplifiers located on a sense plane that is adjacent to the first plane, at least one sense amplifier being associated with each group, wherein no memory cells are located on the sense plane;
wherein multiple memory cells are simultaneously sensed by electrically connecting the multiple memory cells to sense amplifiers belonging to groups associated with the multiple memory cells.

2. The memory cell array sensing system of claim 1, wherein a sense amplifier is associated with a group of memory cells if the sense amplifier is located directly adjacent to the group of memory cells.

3. The memory cell array sensing system of claim 1, wherein a sense amplifier is associated with a group of memory cells if the sense amplifier is one of the plurality of sense amplifiers that is physically located the closest to the group of memory cells.

4. The memory cell array sensing system of claim 1, wherein the array of memory cells are arranged in rows and columns.

5. The memory cell array sensing system of claim 4, wherein a single word line selects a single row from a selected group of memory cells.

6. The memory cell array sensing system of claim 1, wherein the multiple memory cells are simultaneously sensed through a plurality of bit lines.

7. The memory cell array sensing system of claim 6, wherein the plurality of bit lines are electrically connected to sense amplifiers that are associated with groups of the sensed memory cells, and electrically connected to sense amplifiers that are not associated with groups of the sensed memory cells.

8. The memory cell array sensing system of claim 4, wherein the multiple memory cells are simultaneously sensed by electrically connecting the multiple memory cells to sense amplifiers through input lines that extend along the columns of memory cells, and are connectable between the multiple memory cells and the sense amplifiers.

9. The memory cell array sensing system of claim 7, wherein the inputs lines extend across multiple groups of memory cells, and across multiple sense amplifiers.

10. The memory cell array sensing system of claim 1, wherein a memory cell group area of the first plane is occupied by a group of memory cells, the memory cell group area being defined by a physical pitch between rows of the memory cells.

11. The memory cell array sensing system of claim 10, wherein a sense amplifier area occupied by each sense amplifier of the sense plane, is approximately equal to the memory cell group area occupied by the group of memory cells.

12. The memory cell array sensing system of claim 11, wherein the sense amplifier area of a sense amplifier associated with a group is adjacent to the memory cell group area of the group of memory cells within the same group.

13. The memory cell array sensing system of claim 1, wherein each sense amplifier is connectable to at least one column of memory cells through a selectable multiplexer.

14. A method of sensing a state of a selected memory cells within a memory cell array sensing system, the memory cell array sensing system comprising an array of memory cells located on a first plane of an integrated circuit, the array of memory cells comprising groups of memory cells, wherein each group corresponds to a range of rows of the memory cells, the memory cell array sensing system further comprising a plurality of sense amplifiers located on a sense plane that is adjacent to the first plane, at least one sense amplifier being associated with each group, wherein no memory cells are located on the sense plane, the method comprising:
electrically connecting the multiple memory cells to sense amplifiers belonging to groups associated with the multiple memory cells; and
sensing logic states of the multiple memory cells.

15. The method of sensing a state of a selected memory cells of claim 14, wherein the multiple memory cells are electrically connected to the sense amplifier through input lines that extend along the columns of memory cells, and are connectable between the multiple memory cells and the sense amplifiers.

16. An MRAM memory comprising:
an array of MRAM cells comprising rows and columns of MRAM cells located on a first plane of an integrated circuit, the array of MRAM cells comprising groups of MRAM cells, wherein each group corresponds to a range of rows of the MRAM cells;
a plurality of sense amplifiers located on a sense plane that is adjacent to the first plane, at least one sense amplifier being associated with each group, wherein no MRAM cells are located on the sense plane;
wherein multiple MRAM are simultaneously sensed by electrically connecting the multiple memory cells to sense amplifiers belonging to groups associated with the multiple memory cells.

17. The MRAM memory of claim 16, wherein a sense amplifier is associated with a group of MRAM cells if the sense amplifier is located directly adjacent to the group of MRAM cells.

18. The MRAM memory of claim 16, wherein a sense amplifier is associated with a group of MRAM cells if the sense amplifier is a one of the plurality of sense amplifiers that is physically located closest to the group of MRAM cells.

19. A computer system comprising:
a central processing unit;
MRAM memory connected to the central processing unit, the MRAM memory comprising:
an array of MRAM cells comprising rows and columns of MRAM cells located on a first plane of an integrated circuit, the array of MRAM cells comprising groups of MRAM cells, wherein each group corresponds to a range of rows of the MRAM cells;
a plurality of sense amplifiers located on a sense plane that is adjacent to the first plane, at least one sense amplifier being associated with each group, wherein no memory cells are located on the sense plane;
wherein multiple MRAM are simultaneously sensed by electrically connecting the multiple memory cells to sense amplifiers belonging to groups associated with the multiple memory cell.

20. The computer system of claim 19, wherein a sense amplifier is associated with a group of MRAM cells if the sense amplifier is located directly adjacent to the group of MRAM cells.

21. The computer system of claim 19, wherein a sense amplifier is associated with a group of MRAM cells if the sense amplifier is a one of the plurality of sense amplifiers that is physically located the closest to the group of MRAM cells.

* * * * *